United States Patent
Huang et al.

(10) Patent No.: US 7,564,502 B2
(45) Date of Patent: Jul. 21, 2009

(54) AUTOMATIC GAIN CONTROL ANALOG-TO-DIGITAL CONVERTING SYSTEM AND RELATED METHOD

(75) Inventors: Ke-Chiang Huang, Hsinchu (TW); Ta-Chan Kao, Taipei (TW); Sterling Smith, Hsin-Chu Hsien (TW)

(73) Assignee: MStar Semiconductor, Inc., ChuPei, Hsin-Chu Hsien (TW)

( * ) Notice: Subject to any disclaimer, the term of this patent is extended or adjusted under 35 U.S.C. 154(b) by 634 days.

(21) Appl. No.: 11/163,717

(22) Filed: Oct. 28, 2005

(65) Prior Publication Data

US 2006/0221243 A1   Oct. 5, 2006

Related U.S. Application Data

(60) Provisional application No. 60/594,366, filed on Mar. 31, 2005.

(51) Int. Cl.
*H04N 5/52* (2006.01)
*H03M 1/12* (2006.01)

(52) U.S. Cl. ...................... 348/572; 348/678
(58) Field of Classification Search ........... 348/572, 348/573, 678; 341/155, 126, 139; *H04N 5/52; H03M 1/12*
See application file for complete search history.

(56) References Cited

U.S. PATENT DOCUMENTS

| | | | |
|---|---|---|---|
| 5,161,170 A | 11/1992 | Gilbert et al. |
| 5,231,360 A | 7/1993 | Storey |
| 5,280,356 A | 1/1994 | Hiramatsu |
| 5,341,218 A | 8/1994 | Kaneko |
| 5,379,075 A | 1/1995 | Nagasawa |
| 5,461,489 A | 10/1995 | Ohara |
| 5,532,749 A | 7/1996 | Hong |
| 5,640,670 A | 6/1997 | Samueli |
| 5,696,559 A | 12/1997 | Kim |
| 5,767,751 A | 6/1998 | Magnusson |
| 5,784,118 A | 7/1998 | Yamauchi |
| 5,798,802 A | 8/1998 | Elmis |
| 5,841,488 A | 11/1998 | Rumreich |
| 5,990,968 A | 11/1999 | Naka |
| 6,141,057 A | 10/2000 | Cooper |
| 6,211,918 B1 | 4/2001 | Uwabata |
| 6,340,993 B1 | 1/2002 | Hasegawa |
| 6,522,365 B1 | 2/2003 | Levantovsky |
| 6,522,369 B2 | 2/2003 | Ohta |
| 6,580,382 B2 | 6/2003 | Yung |

(Continued)

FOREIGN PATENT DOCUMENTS

GB    2 332 313 A    6/1999

(Continued)

*Primary Examiner*—Sherrie Hsia
(74) *Attorney, Agent, or Firm*—Winston Hsu

(57) ABSTRACT

An analog-to-digital converting system with automatic gain control. The analog-to-digital converting system includes a programmable gain amplifier (PGA) for receiving and amplifying an input signal by a gain factor to generate an amplified input signal; an ADC, coupled to the PGA, for converting the amplified input signal into a digital signal according to an actual reference voltage signal; and an automatic gain controller, coupled to the PGA and the ADC, for jointly controlling the gain factor set to the PGA and the actual reference voltage signal set to the ADC according to a hysteretic behavior.

18 Claims, 4 Drawing Sheets

U.S. PATENT DOCUMENTS

| | | |
|---|---|---|
| 6,587,144 B1 | 7/2003 | Kim |
| 6,621,523 B2 | 9/2003 | Obitsu |
| 6,650,364 B1 | 11/2003 | Itani |
| 6,707,503 B1 | 3/2004 | Naka |
| 6,724,430 B2 | 4/2004 | Miyoshi |
| 6,768,498 B1 | 7/2004 | Kim |
| 7,061,541 B2 | 6/2006 | Kim |
| 7,095,452 B2 | 8/2006 | Tachibana |
| 7,098,824 B2 | 8/2006 | Yang |
| 7,106,231 B2 | 9/2006 | Smith |
| 7,106,387 B2 | 9/2006 | Takimoto |
| 7,126,645 B2 | 10/2006 | Keen |
| 7,253,755 B1 * | 8/2007 | Fette .......................... 341/155 |
| 7,268,714 B2 * | 9/2007 | Sherry ........................ 341/155 |
| 7,355,653 B2 | 4/2008 | Nagamine |
| 2003/0207675 A1 | 11/2003 | Hughes |
| 2005/0001750 A1 | 1/2005 | Lo |
| 2005/0270212 A1 | 12/2005 | Smith |

FOREIGN PATENT DOCUMENTS

| | | |
|---|---|---|
| JP | 2-301209 | 12/1990 |
| WO | 2004/082136 A1 | 9/2004 |

* cited by examiner

AUTOMATIC GAIN CONTROL ANALOG-TO-DIGITAL CONVERTING SYSTEM AND RELATED METHOD

CROSS REFERENCE TO RELATED APPLICATIONS

This application claims the benefit of U.S. Provisional Application No. 60/594,366, which was filed on 31 Mar. 2005 and is included herein by reference.

BACKGROUND OF THE INVENTION

1. Field of the Invention

The invention relates to a control circuit and method for controlling a gain applied to a composite video signal, and more particularly, to an analog-to-digital converting system having a hysteretic control circuit and related method for jointly adjusting a gain factor of an amplifier and a reference voltage of an analog-to-digital converter to control the gain applied to the composite video signal.

2. Description of the Prior Art

Since the introduction of the Advanced Television Systems Committee (ATSC) standard, great effort has been expended toward perfecting a digital TV system. For compatibility, a digital TV system designed for decoding a digital TV signal that complies with an ATSC specification must also be capable of decoding a composite video signal that complies with specifications of the traditional analog TV systems, such as: the National Television System Committee (NTSC) standard or the Phase Alternate Line (PAL) standard. In this way, compliance with these various specifications offers a user the ability to view TV programs using the same equipment regardless of the specification by which information is being transmitted by a digital TV signal or an analog TV signal.

In advance of performing any signal processing on the incoming composite video signal, an amplitude range of the composite video signal must be properly adjusted such that the following signal processing stages of a video decoding circuit can decode the adjusted composite video signal more accurately. As known to those skilled in this art, the amplitude range of the composite video signal is crucial to a decoding procedure of the composite video signal since both chrominance and luminance information of the composite video signal is related to the amplitude of the composite video signal. Therefore, controlling the amplitude range of the composite video signal is critical to the performance of decoding the composite video signal.

In the prior art, an amplifier is usually adopted for controlling the amplitude of a composite video signal to be limited to a certain pre-determined range. Then an output signal of the amplifier, an adjusted composite video signal, is further digitized by an analog-to-digital converter (ADC). However, this may prevent the ADC from digitizing the adjusted composite video signal in an optimal manner because a reference voltage value of the ADC may be much greater than a maximum amplitude of the adjusted composite video signal. That is to say, if the pre-determined range set to the amplifier cannot be tuned to be only slightly lower than the reference voltage of the ADC then the ADC cannot be fully utilized to improve the performance of a decoder used to decode the composite video signal due to a fact that the quantization error of the ADC becomes greater compared to the pre-determined range of the amplifier. This results in a poor resolution of analog-to-digital converting the composite video signal.

SUMMARY OF THE INVENTION

It is therefore one of the objectives of the claimed invention to provide an analog-to-digital converting system having a hysteretic control circuit and related method for jointly adjusting a gain factor of an amplifier and a reference voltage of an analog-to-digital converter to control a gain applied to a composite video signal, to solve the above-mentioned problems.

The claimed invention provides an analog-to-digital converting system having a programmable gain amplifier (PGA), an analog-to-digital converter (ADC) and an automatic gain controller. The PGA amplifies an input signal by a gain factor to generate an amplified input signal, and the ADC converts the amplified input signal into a digital signal according to an actual reference voltage signal. The automatic gain controller includes an ADC level calculator and a PGA controller. The ADC level calculator, coupled to the ADC, determines a desired reference voltage signal for the ADC according to the digital signal and the currently used actual reference voltage signal. The PGA controller, coupled to the ADC level calculator, the PGA, and the ADC, jointly adjusts the gain factor set to the PGA and the actual reference voltage signal inputted into the ADC according to the desired reference voltage signal. The claimed analog-to-digital converting system could be applied to a video decoder or other devices requiring analog-to-digital converting.

In addition, the claimed invention further provides an automatic gain control method for a programmable gain amplifier (PGA) and an analog-to-digital converter (ADC). The PGA amplifies an input signal by a gain factor to generate an amplified input signal, and the ADC converts the amplified input signal into a digital signal according to an actual reference voltage signal. The automatic gain control method comprises: determining a desired reference voltage signal for the ADC according to the digital signal; and jointly adjusting the gain factor set to the PGA and the actual reference voltage signal inputted into the ADC according to the desired reference voltage signal and a hysteretic behavior.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
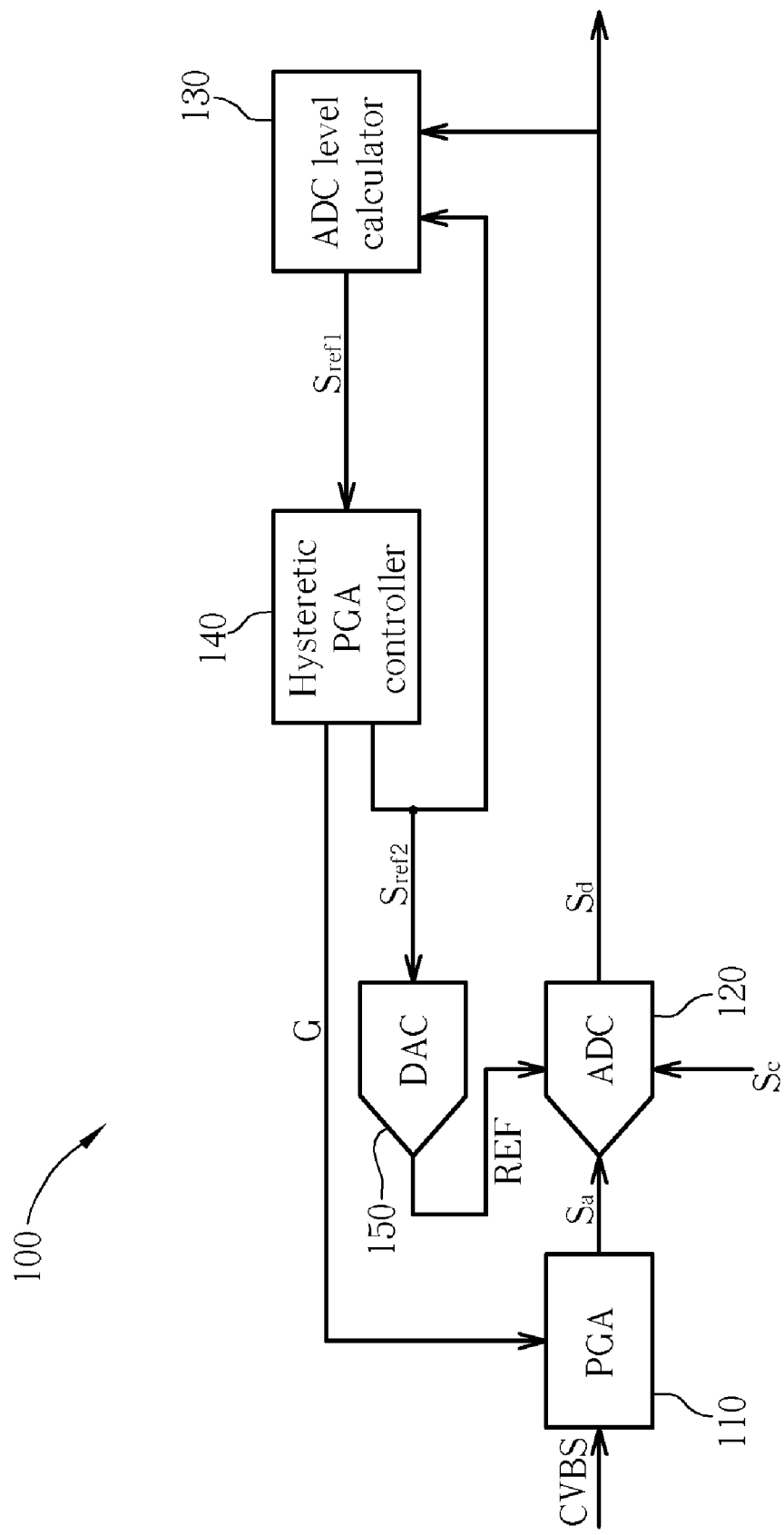
FIG. 1 is a block diagram of an analog-to-digital converting system according to an embodiment of the present invention.

FIG. 1 shows a block diagram of an analog-to-digital converting system 100 according to an embodiment of the present invention. The analog-to-digital converting system 100 comprises a programmable gain amplifier (PGA) 110, an analog-to-digital converter (ADC) 120, an ADC level calculator 130, a hysteretic PGA controller 140, and a digital-to-analog converter (DAC) 150. In this embodiment, the analog-to-digital converting system 100 receives an input signal, preferably a composite video signal CVBS, which is an analog TV signal and complies with an analog TV system specification, such as a National Television System Committee (NTSC) specification or a Phase Alternate Line (PAL) specification. Please note that the input signal, the composite video signal CVBS, used in the present embodiment is only an example for illustrating the functionality of the analog-to-digital converting system 100 but is not meant to be interpreted as being a limitation of the present invention. The operation of the analog-to-digital converting system 100 is detailed as follows.

The PGA 110 amplifies the composite video signal CVBS by a gain factor G to generate an amplified composite video signal $S_a$. The PGA 110 is a pre-processing circuit of the composite video signal CVBS so that the processed composite video signal can be further decoded by following circuits. ADC 120 is required for digitizing the amplified composite video signal $S_a$ to generate a digital signal $S_d$ to be processed in a digital domain. Here, a reference clock $S_c$ and an analog reference voltage value REF are inputted into the ADC 120, and the ADC 120 samples and digitizes the amplified composite video signal $S_a$ by utilizing the reference clock $S_c$ and the analog reference voltage value REF.

The digital signal $S_d$ is then fed into the ADC level calculator 130 for determining a desired reference voltage signal $S_{ref1}$ for the ADC 120. In one embodiment, the ADC level calculator 130 detects the amplitude of the incoming digital signal $S_d$ and receives an actual reference voltage signal $S_{ref2}$ from the hysteretic PGA controller 140. The ADC level calculator 130 compares the detected amplitude value with an ideal pre-determined amplitude value to calculate the next desired reference voltage signal $S_{ref1}$ based on the actual reference voltage signal $S_{ref2}$ currently used. If the detected amplitude is equal to the ideal pre-determined amplitude, the ADC level calculator 130 outputs the feedback signal, the actual reference voltage signal $S_{ref2}$, as the desired reference voltage signal $S_{ref1}$ until a next comparison is performed. If the detected amplitude is larger/smaller than the ideal pre-determined amplitude, the ADC level calculator 130 will output a desired reference voltage signal $S_{ref1}$ which is larger/smaller than the $S_{ref2}$ currently used. The hysteretic PGA controller 140 outputs the gain factor G and an actual reference voltage signal $S_{ref2}$ according to the received desired reference voltage signal $S_{ref1}$. Please note that the above-mentioned implementation and operation of the ADC level calculator 130 is not meant to be interpreted as being a limitation of the present invention.

The embodiment in FIG. 1 can be viewed as an ADC with an automatic gain control (AGC). The AGC comprises the ADC level calculator 130 and the hysteretic PGA controller 140 to perform automatic gain control according to a hysteretic behavior.

Figure 2:
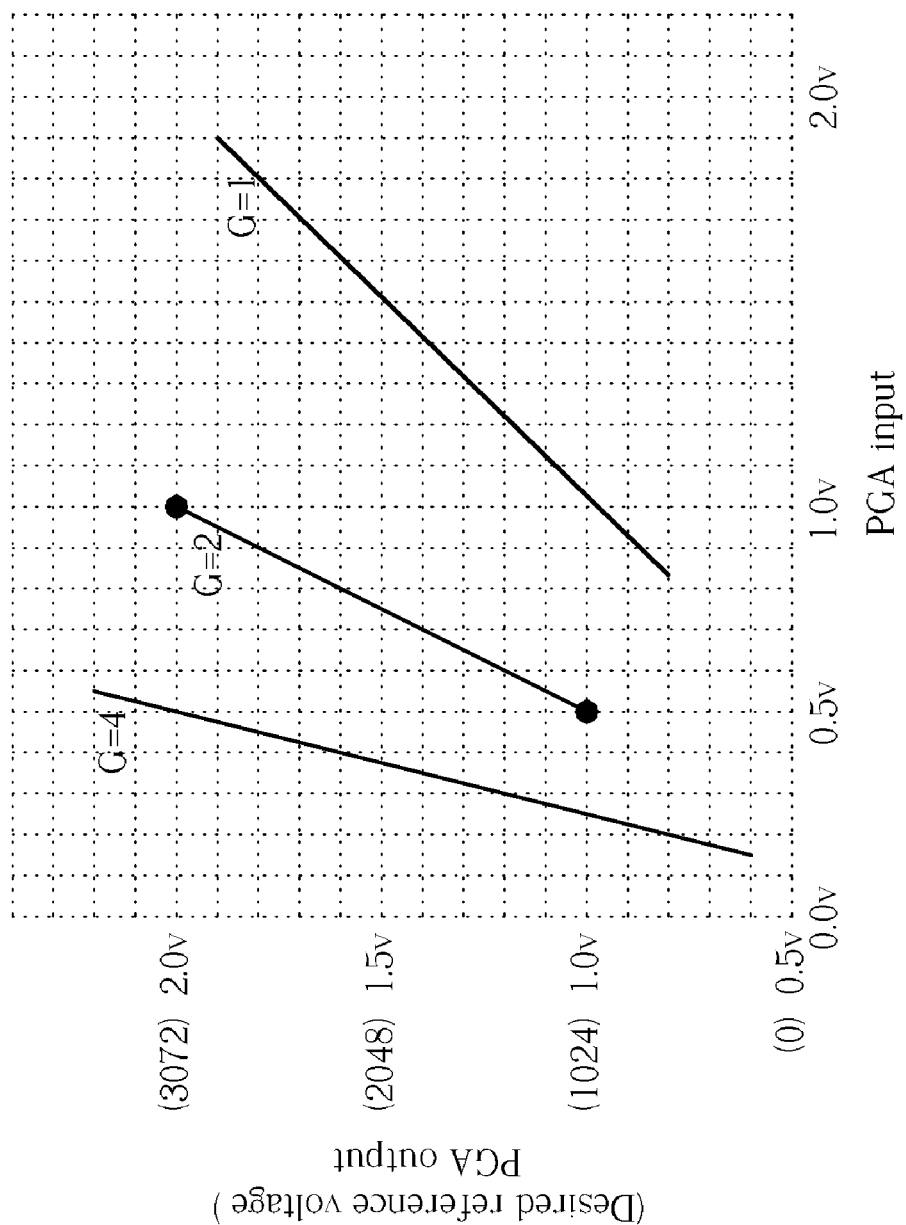
FIG. 2 is a schematic diagram illustrating a switching behavior of a hysteretic PGA controller shown in FIG. 1.

FIG. 2 is a schematic diagram illustrating a switching behavior of a hysteretic PGA controller 140 shown in FIG. 1. The horizontal axis represents input of the PGA 110, and the vertical axis represents the output of the PGA 110 in conjunction with reference voltage value for the ADC 120. FIG. 2 shows three input-to-output curves for the hysteretic PGA controller 140 and each input-to-output relation corresponds to a specific gain factor G set to the PGA 110. Assuming that the second input-to-output curve corresponding to a current gain factor G=2 is selected by the hysteretic PGA controller 140. The hysteretic PGA controller 140 outputs the desired reference voltage signal $S_{ref1}$ as the actual reference voltage signal $S_{ref2}$ if an input signal of the hysteretic PGA controller 140, the desired reference voltage signal $S_{ref1}$, has a reference voltage value in a reference voltage range defined by the second input-to-output relation. Taking the second input-to-output relation shown in the middle of FIG. 2 for example, the reference voltage range is delimited by 1024 and 3072. However, if the desired reference voltage signal $S_{ref1}$ is not in the reference voltage range (1024-3037) of the second input-to-output relation of the hysteretic PGA controller 140 (i.e., reference voltage values transmitted by the desired reference voltage signal $S_{ref1}$ is greater or smaller than the output range of the second input-to-output relation), the hysteretic PGA controller 140 adjusts the gain factor G set to the PGA and enables another input-to-output relation corresponding to the adjusted gain factor G. For example, the third input-to-output relation, shown in the right of FIG. 2, corresponding to a gain factor G=1 is enabled when the values transmitted by the desired reference voltage signal $S_{ref1}$ is too large. As another example, the first input-to-output relation, shown in the right of FIG. 2, corresponding to a gain factor G=4 is enabled when the values transmitted by the desired reference voltage signal $S_{ref1}$ is too small. Please note that the three input-to-output relations mentioned above have overlapped input range such that the hysteretic PGA controller has a hysteretic behavior of switching between two adjacent input-to-output relations. As shown in FIG. 2, the first input-to-output relation and the second input-to-output relation have an overlapped input range, while the second input-to-output relation and the third input-to-output relation have an overlapped input range.

The actual reference voltage signal $S_{ref2}$ is then inputted into the DAC 150 for converting the actual reference voltage signal $S_{ref2}$ into an analog signal transmitting the analog reference voltage value REF. The analog reference voltage value REF is used by the ADC 120 for converting the adjusted composite video signal $S_a$ into the digital signal $S_d$. Please note that while the gain factor G is changed, the reference voltage value REF should be changed accordingly, thereby obtaining the optimum performance of generating the desired digital signal $S_d$ through the PGA 110 and ADC 120. In addition, the DAC 150 can be omitted if the ADC 120 is capable of being directly adjusted via the actual reference voltage signal $S_{ref2}$. That is to say, the ADC 120 is able to receive a digital input signal, instead of an analog input signal, to extract a reference voltage value transmitted by the digital input signal.

Figure 3:
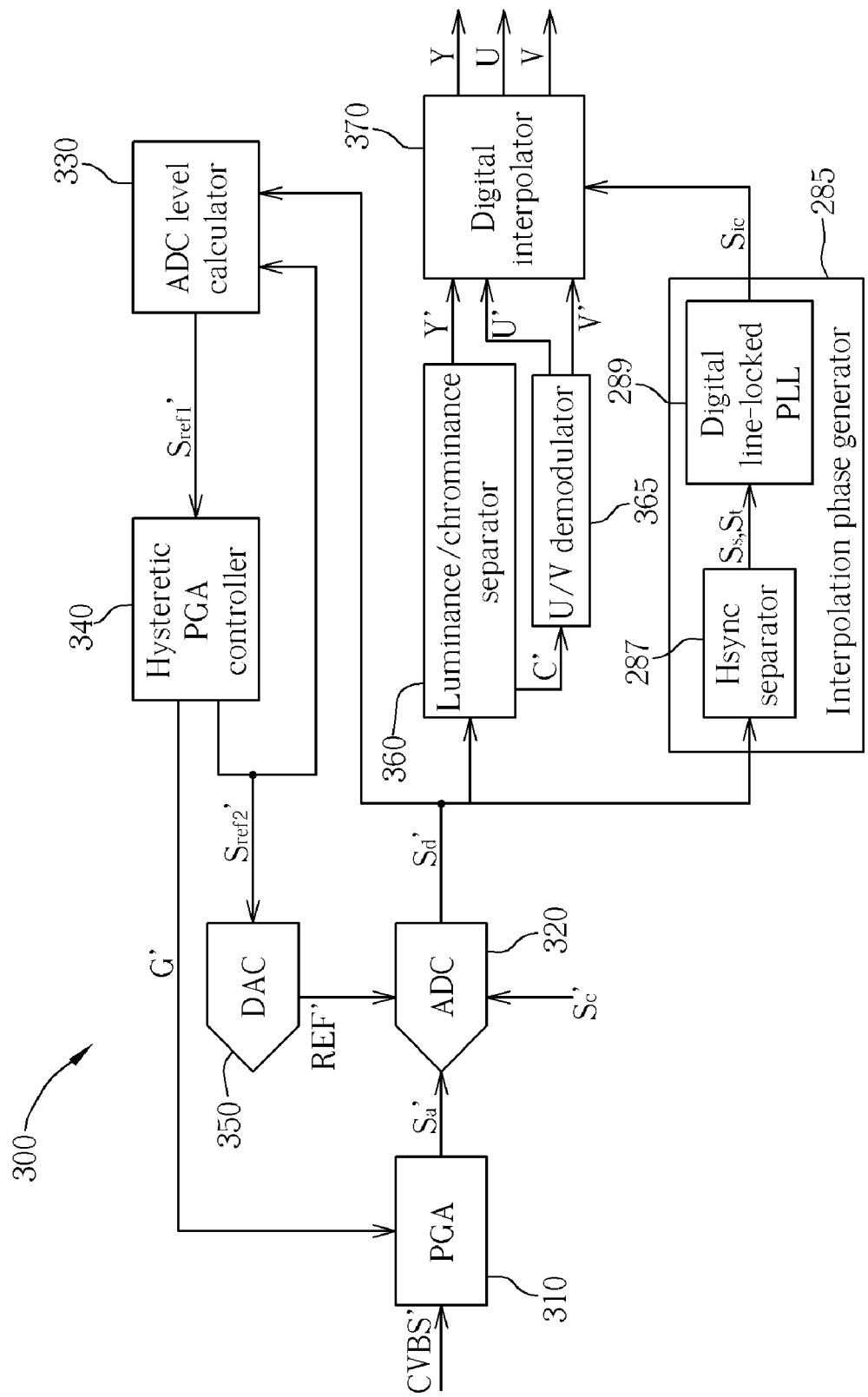
FIG. 3 is a block diagram of a video decoder utilizing the above-mentioned analog-to-digital converting system according to an embodiment of the present invention.

Please refer to FIG. 3. FIG. 3 is a block diagram illustrating a video decoder 300 utilizing the above-mentioned control circuit according to an embodiment of the present invention. The video decoder 300 receives a composite video signal CVBS' and decodes the composite video signal CVBS' to generate a luminance signal Y and a chrominance signal C. The above-mentioned operations to generate a digital signal $S_d'$ as well as to adjust a gain factor G' of a PGA 310 and a reference voltage value REF of an ADC 320 are similar to that of the analog-to-digital converting system 100. Therefore, the similar detailed description is omitted for brevity.

The luminance/chrominance separator 360 receives the digital signal $S_d'$ and generates a pre-luminance signal Y' and a pre-chrominance signal C' by analyzing the digital signal $S_d'$. The pre-chrominance signal C' is further fed into the following U/V demodulator 365. The U/V demodulator 365 demodulates the pre-chrominance signal C' and then generates a first pre-chrominance signal U' as well as a second pre-chrominance signal V'. To facilitate the demodulation of the pre-chrominance signal C', a reference clock $S_c'$ is synchronized to a frequency that is four times as great as a frequency of a sub-carrier of the composite video signal CVBS'. Therefore, a data rate of the digital signal $S_d'$ is also four times as great as the frequency of the sub-carrier of the pre-chrominance signal C' of the composite video signal CVBS'. But this data rate of the digital signal $S_d'$ does not match that required to display a video program transmitted by the composite video signal CVBS' for each scan line on a TV screen. As a result, the digital interpolator 370 re-scales the pre-luminance signal Y', the first pre-chrominance signal U' and the second pre-chrominance signal V' to generate the desired luminance signal Y, the first chrominance signal U and the second chrominance signal V according to an interpolation phase Sic. In this way, data rates of the luminance signal Y and the chrominance signal C matches the rate for displaying pixels at each scan line.

In one embodiment, the synchronized clock $S_c'$ is synchronized to a frequency that is a multiple of four times higher than the frequency of a sub-carrier of the chrominance signal C of the composite video signal CVBS'. Therefore, a down-sampler down-samples the digital signal $S_d'$ to generate a first digital signal with a data rate of four times as great as the frequency of the sub-carrier of the composite video signal CVBS'. Also, a digital filter can be added between the ADC 320 and the above-mentioned down-sampler to filter out a high frequency noise component of the digital signal $S_d'$ and then generates a filtered signal to be inputted to the above-mentioned down-sampler. As the data rate of the digital signal $S_d'$ increases, the better performance is obtained. In this way, the high frequency noise component can be filtered out more thoroughly. Then, the first digital signal is inputted into the ADC level calculator 330, the luminance/chrominance separator 360, and the interpolation phase generator 380 to proceed following processing.

As shown in FIG. 3, the interpolation phase generator 380 contains an Hsync separator 382 and a digital line-locked phase-locked loop (PLL) 384. The Hsync separator 382 receives the digital signal $S_d'$ and separates the horizontal synchronization tips to determine the starting and terminating boundary of each scan line for displaying a video program transmitted by the composite video signal CVBS', according to two successive horizontal synchronization (Hsync) tips. A horizontal synchronization tip is defined in a specification of an analog TV system for recognizing a starting point of a scan line. According to the starting boundary signal $S_s$ and the terminating boundary signal $S_t$, the digital line-locked PLL 384 generates the interpolation phase $S_{ic}$ utilized by the digital interpolator 370 to re-scale the pre-luminance signal Y', the first pre-chrominance signal U' and the second pre-chrominance signal V'.

Figure 4:
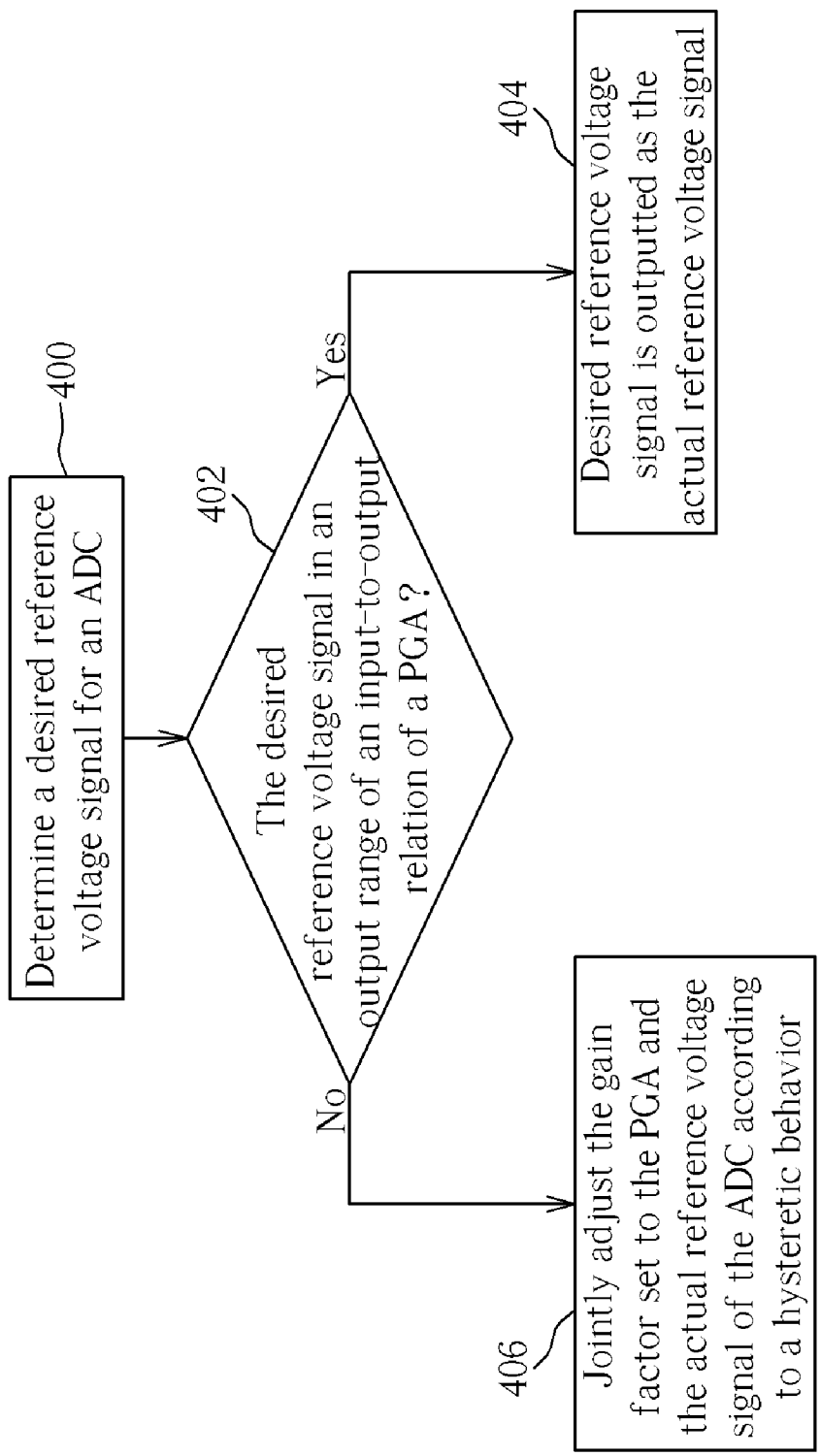
FIG. 4 is a flowchart of the automatic gain control method according to an embodiment of the present invention.

FIG. 4 is a flowchart illustrating the automatic gain control method according to an embodiment of the present invention. The automatic gain control method is detailed as follows.

Step 400: Determining a desired reference voltage signal for an ADC according to a digital signal outputted from the ADC and the currently used actual reference voltage signal.

Step 402: Check if the desired reference voltage signal corresponding to the gain factor currently set to a PGA is in an output range of a first input-to-output relation of the PGA. If yes, go to step 404; otherwise, go to step 406.

Step 404: The desired reference voltage signal is outputted as the actual reference voltage signal.

Step 406: Jointly adjust the gain factor set to the PGA and the actual reference voltage signal applied to the ADC according to the desired reference voltage signal and a hysteretic behavior, where a second input-to-output relation is adopted and the actual reference voltage signal corresponding to the adjusted gain factor is outputted according to the second input-to-output relation of the PGA.

According to the present invention, a PGA is used to coarsely amplify an input signal and a following ADC is used to digitize the input signal in utilization of an adaptively tuned reference voltage value. Thus, an input range of the ADC is fully utilized to digitize the amplified input signal so as to minimize a ratio of the quantization error to the input range of the ADC. Further, the disclosed hysteretic PGA controller prevents the gain factor set to the PGA from being switched back and forth (i.e., oscillating) between two candidate gain factors. Therefore, the present invention achieves a higher performance for converting the incoming composite video signal to the desired digital signal.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An analog-to-digital converting system with automatic gain control, comprising:
   a programmable gain amplifier (PGA) for receiving and amplifying an input signal by a gain factor to generate an amplified input signal;
   an analog-to-digital converter (ADC), coupled to the PGA, for converting the amplified input signal into a digital signal according to an actual reference voltage signal; and
   an automatic gain controller, coupled to the PGA and the ADC, for jointly controlling the gain factor set to the PGA and the actual reference voltage signal set to the ADC according to a hysteretic behavior.

2. The analog-to-digital converting system of claim 1, wherein the automatic gain controller comprises:
   an ADC level calculator, coupled to the ADC, for determining a desired reference voltage signal for the ADC according to the digital signal and the currently used actual reference voltage signal; and
   a PGA controller, coupled to the ADC level calculator, the PGA, and the ADC, for jointly adjusting the gain factor set to the PGA and the actual reference voltage signal applied to the ADC according to the desired reference voltage signal.

3. The analog-to-digital converting system of claim 2, further comprising:
   a digital-to-analog converter (DAC), coupled between the PGA controller and the ADC, for converting the actual reference voltage signal into an analog reference voltage set to the ADC.

4. The analog-to-digital converting system of claim 2, wherein if the desired reference voltage signal corresponding to the gain factor currently set to the PGA is in an output range of a first input-to-output relation of the PGA, the PGA controller outputs the desired reference voltage signal as the actual reference voltage signal.

5. The analog-to-digital converting system of claim 4, wherein if the desired reference voltage signal corresponding to the gain factor currently set to the PGA is not in the output range of the first input-to-output relation of the PGA, the PGA controller adjusts the gain factor set to the PGA, adopts a second input-to-output relation and outputs the actual reference voltage signal corresponding to the adjusted gain factor according to the second input-to-output relation of the PGA.

6. The analog-to-digital converting system of claim 5, wherein the adjusted actual reference voltage signal is fed back to the ADC level calculator for the calculation of the next desired voltage reference signal.

7. The analog-to-digital converting system of claim 5, wherein the first and second input-to-output relations have an overlapped input range defining the hysteretic behavior of the PGA controller for switching between the first and second input-to-output relations.

8. The analog-to-digital converting system of claim 1, wherein the analog-to-digital converting system is implemented in a video decoder.

9. The analog-to-digital converting system of claim 1, wherein the input signal is a composite video signal.

10. The analog-to-digital converting system of claim 9, wherein the composite video signal complies with an NTSC (National Television System Committee) specification or a PAL (Phase Alternate Line) specification.

11. An automatic gain control method for controlling a programmable gain amplifier (PGA) in conjunction with an analog-to-digital converter (ADC), the PGA amplifying an input signal by a gain factor to generate an amplified input signal, the ADC converting the amplified input signal into a digital signal according to an actual reference voltage signal, the automatic gain control method comprising:
  determining a desired reference voltage signal for the ADC according to the digital signal and the currently used actual reference voltage signal; and
  jointly adjusting the gain factor set to the PGA and the actual reference voltage signal applied to the ADC according to the desired reference voltage signal and a hysteretic behavior.

12. The automatic gain control method of claim 11, further comprising:
  converting the actual reference voltage signal into an analog reference voltage set to the ADC.

13. The automatic gain control method of claim 11, wherein if the desired reference voltage signal corresponding to the gain factor currently set to the PGA is in an output range of a first input-to-output relation of the PGA, the desired reference voltage signal is outputted as the actual reference voltage signal.

14. The automatic gain control method of claim 13, wherein if the desired reference voltage signal corresponding to the gain factor currently set to the PGA is not in the output range of the first input-to-output relation of the PGA, the gain factor set to the PGA is adjusted, a second input-to-output relation is adopted, and the actual reference voltage signal corresponding to the adjusted gain factor is outputted according to the second input-to-output relation of the PGA.

15. The automatic gain control method of claim 14, wherein the adjusted actual reference voltage signal is further utilized to update the desired voltage reference signal.

16. The automatic gain control method of claim 14, wherein the first and second input-to-output relations have an overlapped input range defining the hysteretic behavior of switching between the first and the second input-to-output relations.

17. The automatic gain control method of claim 11, wherein the input signal is a composite video signal.

18. The automatic gain control method of claim 17, wherein the composite video signal complies with an NTSC (National Television System Committee) specification or a PAL (Phase Alternate Line) specification.

\* \* \* \* \*